United States Patent
Sutardja et al.

(10) Patent No.: US 9,466,596 B2
(45) Date of Patent: Oct. 11, 2016

(54) GEOMETRY OF MOS DEVICE WITH LOW ON-RESISTANCE

(75) Inventors: Sehat Sutardja, Los Altos Hills, CA (US); Ravishanker Krishnamoorthy, Singapore (SG)

(73) Assignee: Marvell World Trade Ltd., St. Michael (BB)

( * ) Notice: Subject to any disclaimer, the term of this patent is extended or adjusted under 35 U.S.C. 154(b) by 2397 days.

(21) Appl. No.: 11/964,696

(22) Filed: Dec. 26, 2007

(65) Prior Publication Data
US 2008/0157195 A1    Jul. 3, 2008

Related U.S. Application Data

(60) Provisional application No. 60/882,250, filed on Dec. 28, 2006.

(51) Int. Cl.
| | |
|---|---|
| *H01L 29/66* | (2006.01) |
| *H01L 27/02* | (2006.01) |
| *H01L 21/8234* | (2006.01) |
| *H01L 27/088* | (2006.01) |
| *H01L 29/06* | (2006.01) |

(Continued)

(52) U.S. Cl.
CPC ... *H01L 27/0207* (2013.01); *H01L 21/823437* (2013.01); *H01L 27/088* (2013.01); *H01L 29/0692* (2013.01); *H01L 29/0696* (2013.01); *H01L 29/4238* (2013.01); *H01L 29/78* (2013.01); *H01L 29/7835* (2013.01); *H01L 29/41725* (2013.01); *H01L 29/41758* (2013.01)

(58) Field of Classification Search
CPC ............... H01L 21/823437; H01L 27/0207; H01L 27/088; H01L 29/0692; H01L 29/41725; H01L 29/41758; H01L 29/4238; H01L 29/78; H01L 29/7835
USPC ....... 257/337, 341, 343, 355, 356, 360, 401, 257/E23.153, E29.013, E29.027, E29.116, 257/E29.118, E28.121, E29.146, E29.255, 257/E29.256

See application file for complete search history.

(56) References Cited

U.S. PATENT DOCUMENTS

| | | | |
|---|---|---|---|
| 3,783,349 A | 1/1974 | Beasom | 317/235 |
| 5,192,989 A * | 3/1993 | Matsushita et al. | 257/342 |

(Continued)

FOREIGN PATENT DOCUMENTS

| | | |
|---|---|---|
| CN | 1777997 A | 5/2006 |
| EP | 1115158 A1 | 7/2001 |

(Continued)

OTHER PUBLICATIONS

PCT International Search Report in corresponding International Application No. PCT/US 07/88866, dated May 16, 2008.

(Continued)

*Primary Examiner* — Meiya Li (57) ABSTRACT

A Metal Oxide Semiconductor (MOS) device formed on a substrate and a method for forming the MOS device. The MOS device includes a drain region, a gate region surrounding the drain region, source regions arranged around the gate region and across from the drain region, and bulk regions arranged around the gate region and separating the source regions. The gate region is formed in a loop around the drain region. In this manner, the on-resistance (Ron) of a MOS device is decreased without also increasing the area of the MOS device.

11 Claims, 10 Drawing Sheets

(51) Int. Cl.
*H01L 29/423* (2006.01)
*H01L 29/78* (2006.01)
*H01L 29/417* (2006.01)

(56) References Cited

U.S. PATENT DOCUMENTS

| | | | |
|---|---|---|---|
| 5,635,742 A * | 6/1997 | Hoshi et al. | 257/337 |
| 5,714,784 A | 2/1998 | Ker et al. | 257/360 |
| 5,852,315 A | 12/1998 | Ker et al. | 257/355 |
| 5,965,925 A | 10/1999 | Kornachuk et al. | |
| 6,057,568 A | 5/2000 | Kumagai | 257/204 |
| 6,064,088 A | 5/2000 | D'Anna | |
| 7,126,187 B2 | 10/2006 | Aoki et al. | |
| 2002/0050619 A1 | 5/2002 | Kawaguchi et al. | |
| 2003/0209759 A1 | 11/2003 | Blanchard | |
| 2004/0178454 A1* | 9/2004 | Kuroda et al. | 257/360 |
| 2012/0032270 A1 | 2/2012 | Okumura et al. | |

FOREIGN PATENT DOCUMENTS

| | | |
|---|---|---|
| EP | 2030237 B1 | 2/2011 |
| JP | 57037875 A | 3/1982 |
| JP | 61290767 A | 12/1986 |
| JP | 10214971 A | 8/1998 |
| JP | 03257969 B2 | 2/1999 |
| JP | 11074505 A | 3/1999 |
| JP | 11074517 A | 3/1999 |
| JP | 11251445 A | 9/1999 |
| JP | 2000208759 A | 7/2000 |
| JP | 2001257360 A | 9/2001 |
| JP | 2002503034 A | 1/2002 |
| JP | 2002110970 A | 4/2002 |
| JP | 2004186511 A | 7/2004 |
| JP | 2006120952 A | 5/2006 |
| JP | 2006-257274 A | 9/2006 |
| JP | 2006344817 A | 12/2006 |
| JP | 2008078469 A | 4/2008 |
| JP | 05082782 B2 | 9/2012 |
| TW | 274150 | 4/1996 |
| TW | 281798 | 7/1996 |
| TW | 341272 | 9/1998 |
| WO | WO2007136556 A2 | 11/2007 |

OTHER PUBLICATIONS

Written Opinion of the International Searching Authority in corresponding International Application No. PCT/US 07/88866, dated May 16, 2008.

* cited by examiner

GEOMETRY OF MOS DEVICE WITH LOW ON-RESISTANCE

CROSS-REFERENCE TO RELATED APPLICATION

This application claims the benefit of U.S. Provisional Patent Application No. 60/882,250, filed Dec. 28, 2006, the contents of which are hereby incorporated by reference as if fully stated herein.

FIELD OF THE INVENTION

The present invention relates to the geometry of a Metal Oxide Semiconductor (MOS) device, so as to produce a device having a low on-resistance, and particularly to a Square-Double-diffused Metal Oxide Semiconductor (SQD-MOS) device with such a geometry.

BACKGROUND OF THE INVENTION

Figure 1:
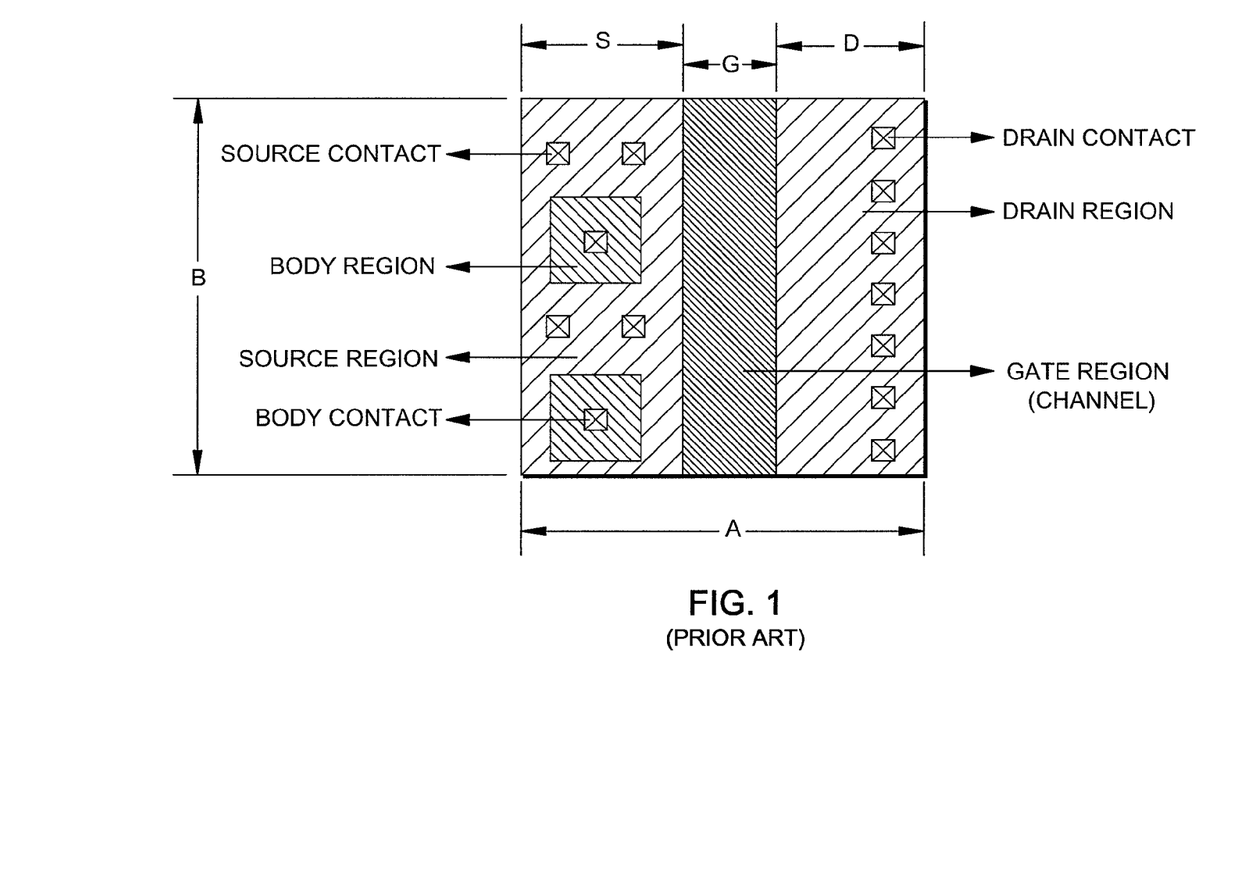
FIGS. 1, 2, and 3 are diagrams depicting a top view of a comparative Metal Oxide Semiconductor (MOS) structure or an array of MOS cells.

For comparison purposes, FIG. 1 shows a top view of the geometry of a conventional Metal Oxide Semiconductor (MOS) structure with gate, drain, source, and body (bulk) regions. The width of the MOS channel (gate region) is B and the length of the MOS channel is G. The lengths of the source and drain regions, S and D, respectively, are based on design rules of a particular process technology to achieve certain reliability and voltage capabilities. The total area of the MOS is A×B.

The on-resistance (Ron) of the MOS depends on the width B and length G of the MOS channel. A larger width B results in a smaller Ron, and a smaller length G results in a smaller Ron. By reducing the Ron, the number of times the MOS switches within a given time period may be increased, and thus higher processing speeds, and lower energy use per switching event, may be attained.

However, in reducing the Ron, if the width B of the MOS channel increases, the area of the MOS may increase. An increased MOS area may result in chips with less computing power in the same area, or larger chips with increased manufacturing costs. Therefore, it is advantageous to reduce the Ron without also increasing the area of the MOS.

Figure 2:
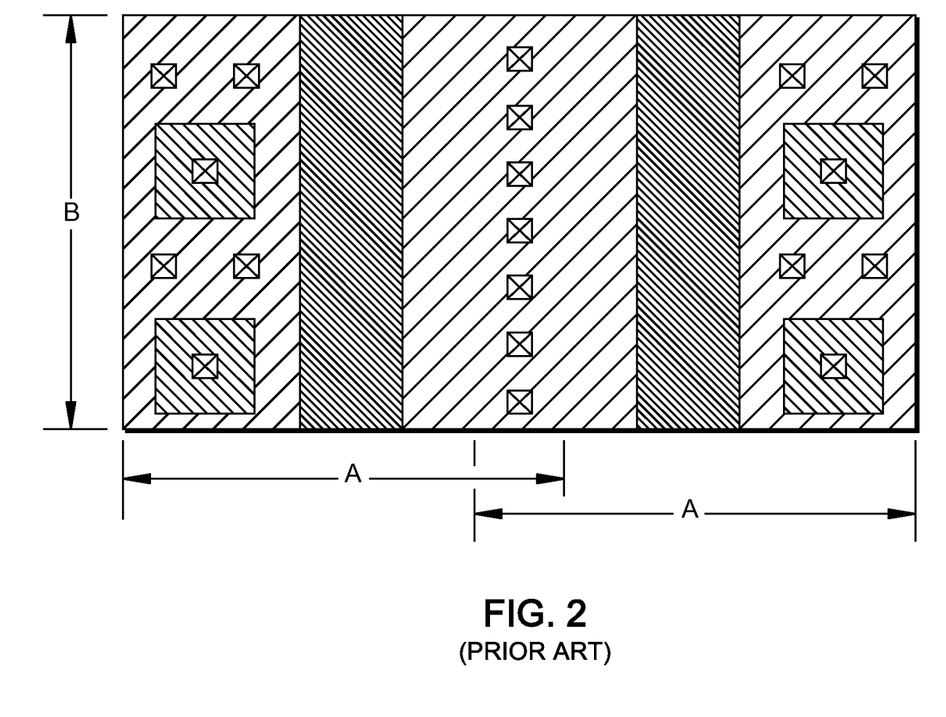
Figure 3:
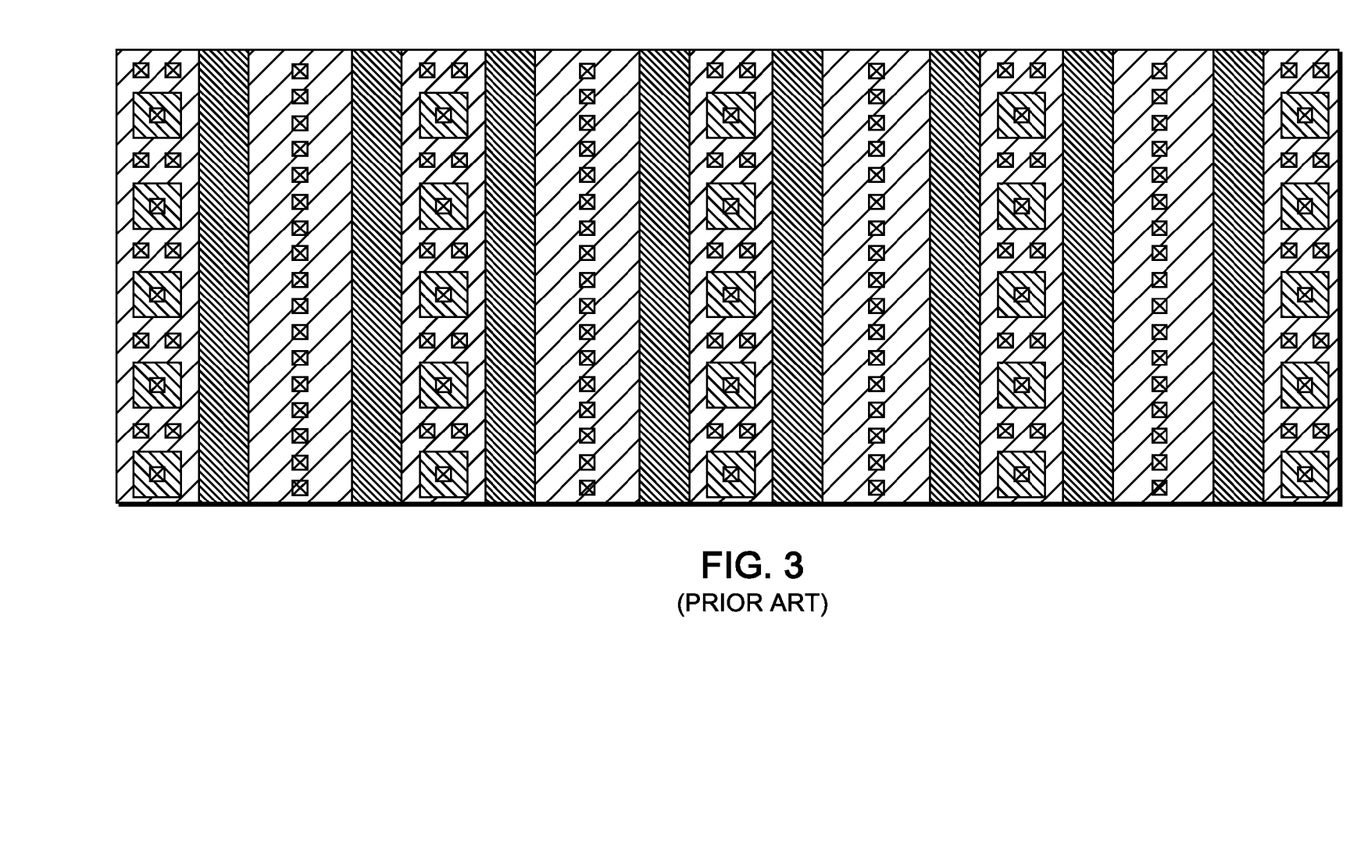

One technique to reduce the Ron consists of mirroring two basic MOS structures such that the drain regions of each structure overlap, as shown in the geometry of FIG. 2. According to this technique, the effective width B is doubled (i.e., there are two MOS channels each with a width of B), thereby decreasing the Ron, while the total area of the structure is less than double that of a single MOS structure (i.e., less than double A×B). This structure can be repeated as shown in FIG. 3 to obtain an even smaller Ron.

The present invention provides a geometry for a MOS device that obtains even further reductions in Ron of the device, ordinarily without also increasing the area of the device.

SUMMARY OF THE INVENTION

The invention capitalizes on the recognition by the inventors herein that if the gate region (formed above a channel region) is formed in a loop surrounding a drain region, channel width is increased for a given MOS area. In this manner, because the effective width of the channel is increased, the Ron of a MOS is decreased without also increasing the area of the MOS.

Thus, in one aspect, the invention provides a Metal Oxide Semiconductor (MOS) device, and a method of forming the MOS device on a substrate. The MOS includes a drain region, a gate region surrounding the drain region in a loop, source regions arranged around the gate region and across from the drain region, and bulk regions arranged around the gate region and separating the source regions.

By virtue of the foregoing, the Ron of the MOS is decreased. The looped gate region provides increased gate width without also increasing the area of the MOS. By reducing the Ron, MOS switching times may be increased, and thus higher processing speeds, and lower energy use per switching event, may be attained.

Arranging the bulk regions around the gate region and separating the source regions may provide further reduction in MOS area, as compared to a conventional structure. Because bulk regions are arranged around the gate region, an additional bulk region surrounding the source regions may not be needed. In the normal operation of the MOS, bulk contacts, included in the bulk regions, do not carry any current. The bulk contacts provide a voltage bias to the bulk regions of the MOS. Therefore, the number of bulk contacts can be reduced without affecting the performance of the MOS. Because the bulk region may be excluded from the source region, the size of the source region may be reduced. By reducing the area of the MOS, more computing power may be provided in the same area, or smaller chips may be produced, thereby reducing manufacturing costs.

The gate region can be formed in a closed loop and the gate region can have a shape corresponding to that of the drain region. The drain region can have a circular shape or a multi-sided polygon shape including one of a square, a rectangle, a hexagon and an octagon.

A channel region can be formed beneath the gate region and the channel region can be configured so that current can flow from each source region to the drain region. The substrate can have a shape corresponding to that of the drain region, and the bulk regions can be arranged in corners of the substrate. Arranging the bulk regions in corners of the substrate may maximize effective channel width.

The MOS device can be a transistor and the substrate can be a silicon substrate. The gate region can include polysilicon and the MOS device can be a Square DMOS (SQD-MOS). The drain region and at least one of the source regions can have respective contacts, and the distance between the drain region contacts and the gate region can be greater than the distance between the source region contacts and the gate region to achieve a larger breakdown voltage from the drain region to the source region.

In another aspect, the invention provides a Metal Oxide Semiconductor (MOS) device having a plurality of MOS transistor cells formed in an array on a substrate, and a method for forming the MOS device. Each MOS transistor cell includes a drain region, a gate region surrounding the drain region, source regions arranged around the gate region and across from the drain region, and bulk regions arranged around the gate region and separating the source regions. The gate region is formed in a loop around the drain region. The source regions overlap the corresponding source regions of an adjacent MOS transistor cell.

This brief summary has been provided so that the nature of the invention may be understood quickly. A more complete understanding of the invention can be obtained by reference to the following detailed description of the preferred embodiment thereof in connection with the attached drawings.

DETAILED DESCRIPTION OF THE PREFERRED EMBODIMENT

Figure 4:
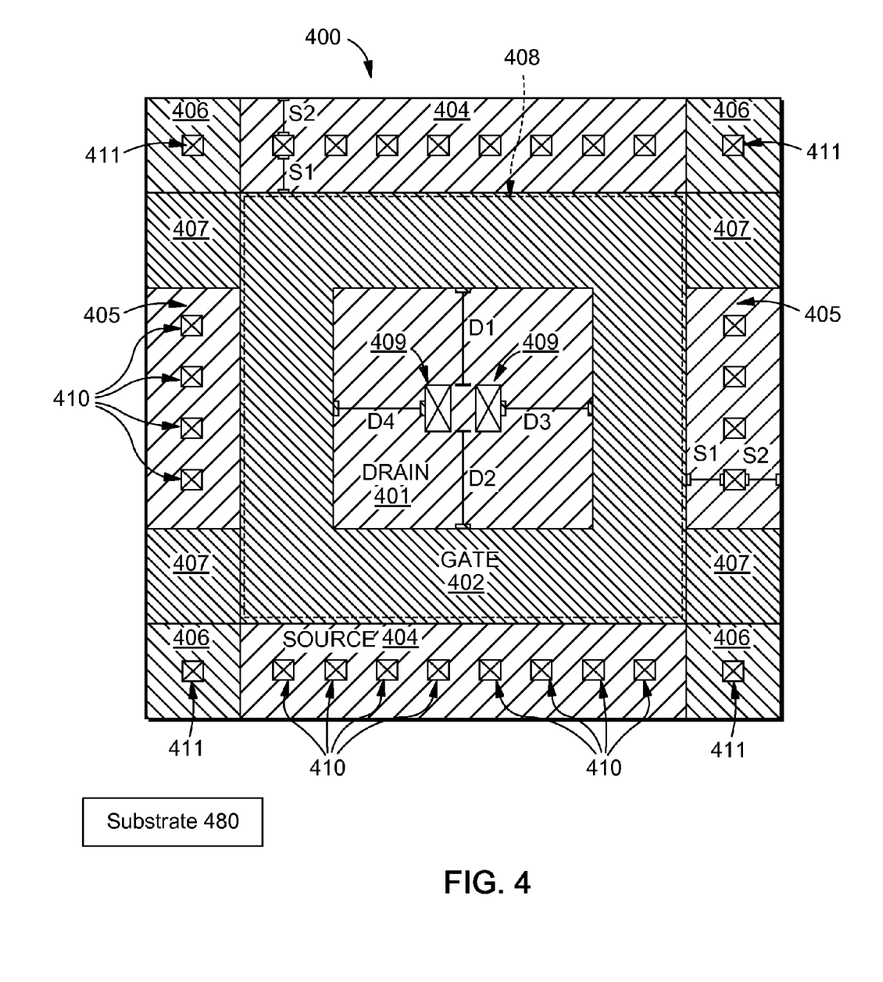
FIG. 4 is a diagram depicting a top view of a MOS structure in accordance with a first embodiment of the invention.

FIG. 4 is a diagram depicting a top view of a Metal Oxide Semiconductor (MOS) structure of a single MOS cell 400 in accordance with an embodiment of the invention. As illustrated in FIG. 4, cell 400 is formed in the shape of a square, but in other embodiments, cell 400 can have a circular shape or any multi-sided polygon shape, such as for example, a rectangle, a hexagon, or an octagon. Cell 400 can be, for example, a MOS transistor, including an n-type MOS (NMOS) and a p-type MOS (PMOS) transistor, and cell 400 can be a SQDMOS. Cell 400 includes at least a drain region 401, a gate region 402, source regions 404 and 405, and bulk regions 406 formed on a substrate, such as, for example, a silicon substrate, or any other suitable type of substrate.

FIG. 4 schematically illustrates a substrate 480, on which the drain region 401, the gate region 402, the source regions 404 and 405, and the bulk regions 406 are formed. FIG. 4 illustrates the top view of the single MOS cell 400, and the substrate 480 is formed underneath the drain region 401, the gate region 402, the source regions 404 and 405, and the bulk regions 406—hence, the substrate 480 (or at least a part of the substrate 480) is not visible in the top view of FIG. 4. Accordingly, to merely indicate the presence of the substrate 480 in the single MOS cell 400, the substrate 480 is illustrated as a symbolic box separate from the single MOS cell 400. The position and shape of the substrate 480 in FIG. 4 does not represent an actual position and shape of the substrate in the single MOS cell 400.

As illustrated in FIG. 4, drain region 401 is formed in the shape of a square, but in other embodiments, drain region 401 can have a circular shape or any multi-sided polygon shape, such as for example, a rectangle, a hexagon, or an octagon. Drain region 401 includes drain contacts 409. As illustrated, two drain contacts 409 are shown, but other embodiments may employ a different number of drain contacts, depending, in part, upon operating requirements, such as, for example, current requirements. Drain contacts 409 are butted to optimise the area for a given current capability. In the illustrated embodiment, distances D1 to D4 between drain contacts 409 and gate region 402 are substantially similar, but in other embodiments, distances D1 to D4 may be different, depending, in part, upon the shape of drain region 401.

Gate region 402 surrounds drain region 401. Gate region 402 is formed around drain region 401 in a closed loop having a shape corresponding to that of drain region 401. As illustrated, gate region 402 has a square shape, but in other embodiments, gate region 402 can have a circular shape or any multi-sided polygon shape, such as for example, a rectangle, a hexagon, or an octagon, depending, in part, upon the shape of drain region 401. Gate region 402 can include, for example, polysilicon, or any other suitable type of conducting or semi-conducting material. A channel region 408 can be formed beneath gate region 402, and channel region 408 can be configured so that current flows from each source region 404 and 405 to drain region 401. Gate contacts (not shown) may be attached to regions 407 electrically coupled to gate region 402. Regions 407 can include the same material as gate region 402.

Arranged around gate region 402 are source regions 404 and 405, bulk regions 406, and regions 407. A source region 404 or 405 is arranged on each side of gate region 402 in a manner such that each side of drain region 401 is aligned with a source region having an equal or greater width. In this manner, current flow through channel 408 may be maximized. Bulk regions 406 and regions 407 are arranged around gate region 402 such that they are not aligned with a side of drain region 402. In particular, bulk regions 406 are arranged in corners of cell 400, where they may not be attached to gate region 402 (and channel 408), and regions 407 are arranged such that they may be attached to portions of gate region 402.

Because bulk regions 406 are not arranged within source regions 404 and 405, as in a conventional MOS cell (FIG. 1), the size of source regions 404 and 405 may be smaller than the size of source regions in the conventional MOS cell.

As illustrated, source regions 404 and 405 are formed in the shapes rectangles, and bulk regions 406 and regions 407 are formed in the shapes of squares. However, in other embodiments, source regions 404 and 405, bulk regions 406, and regions 407 can have a circular shape or any multi-sided polygon shape, such as for example, a triangle, a square, a rectangle, a hexagon, or an octagon, depending, in part, upon the shape of cell 400 and the arrangement and/or shapes of source regions 404 and 405, and bulk regions 406 and regions 407.

As described above, regions 407 may include gate contacts (not shown) electrically coupled to gate region 402. Bulk regions 406 include bulk contacts 411, and source regions 404 and 405 include source contacts 410. A number of source contacts 410 and bulk contacts 411 different than the illustrated number of contacts may be employed in other embodiments, depending, in part, upon operating requirements, such as, for example, current requirements.

As illustrated, distances S1 between source contacts 410 and gate region 402 are shorter than distances D1 to D4 between drain contacts 409 and gate region 402, but in other embodiments, the relationship between distances S1 and D1 to D4 may be different, depending, in part, upon breakdown voltage.

Figure 5A:
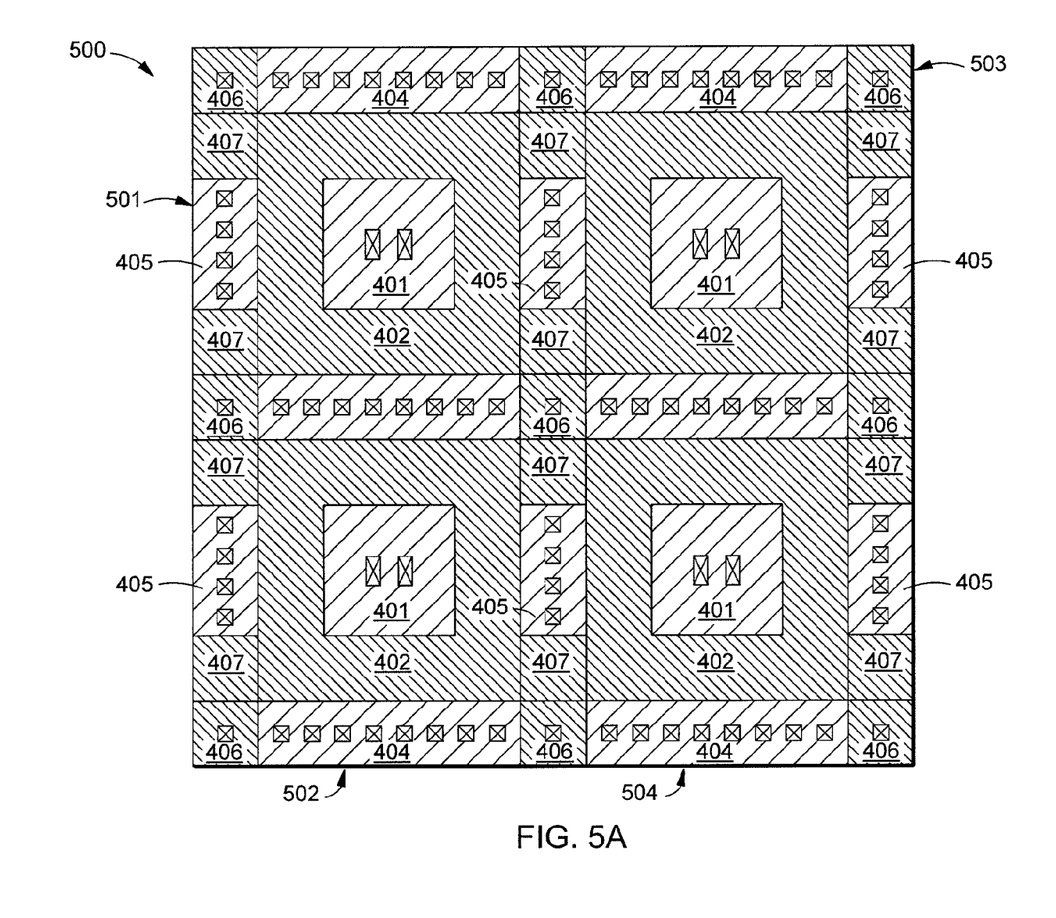
FIGS. 5A and 5B are diagrams depicting a top view of an array of MOS cells in accordance with a second embodiment of the invention.

FIG. 5A is a diagram depicting a top view of an array of four MOS cells 500 in accordance with an example embodiment of the invention. Each cell has the structure of MOS cell 400 of FIG. 4. Cells 501 to 504 are arranged such that their source regions 404 and 405 overlap. In this manner, the total area of cell array 500 may be less than four times the area of an individual cell 400.

Figure 5B:
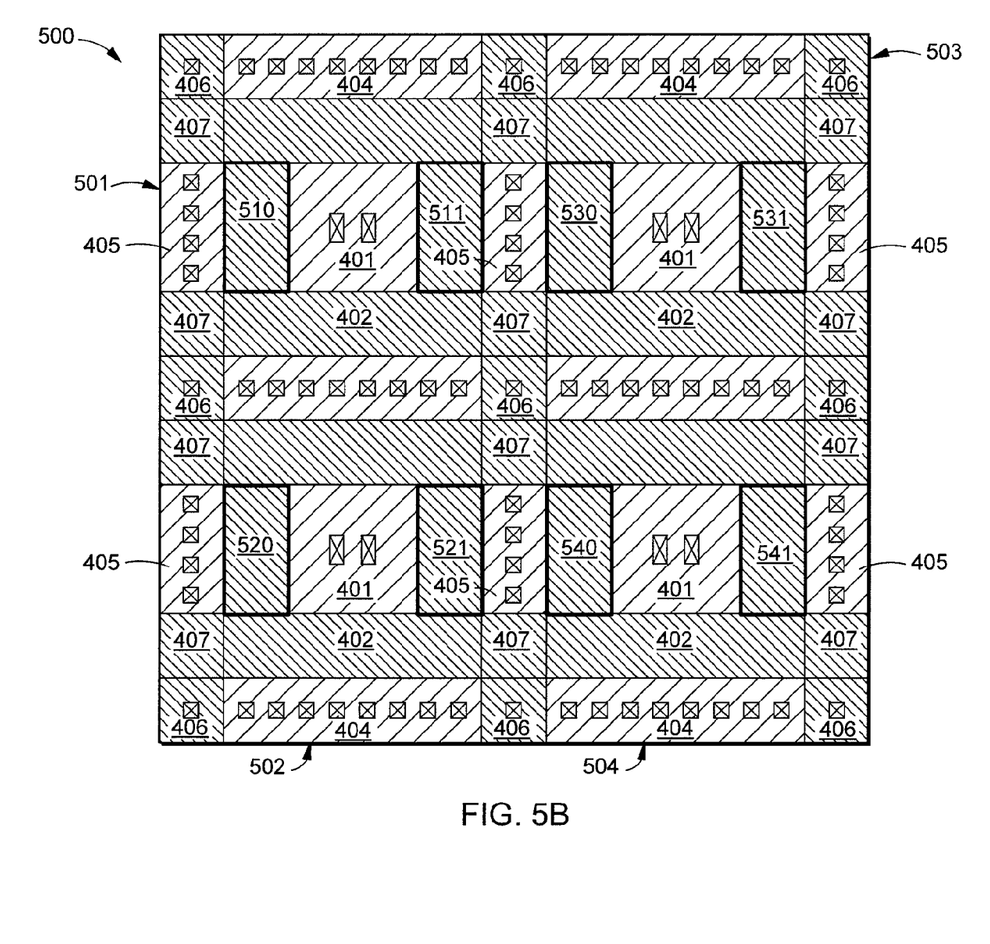

By arranging gate regions 402 so that it is looped around drain regions 401, channel width may be increased by gate region portions 510, 511, 520, 521, 530, 531, 540, and 541 as illustrated in FIG. 5B. While some channel width may be lost because there may be no effective channel under regions 407 (i.e., regions 407 may not separate a source region and a drain region), this loss may be less than the gain in channel width.

In this manner, the structure of MOS cell 400 (and MOS cell array 500) may have a Ron less than the Ron of a conventional MOS cell (or cell array). By having gate regions 402 looped around drain regions 401, the net channel width may be increased without increasing the area of the MOS structure. By reducing the Ron, MOS switching times may be increased, and thus higher processing speeds, and lower energy use per switching event, may be attained.

Because bulk regions are arranged around the gate region, an additional bulk region surrounding the source regions may not be needed. Because the bulk region may not be included in the source region, the size of the source region may be reduced. By reducing the area of the MOS, more computing power may be provided in the same area, or smaller chips may be produced, thereby reducing manufacturing costs.

Figure 6A:
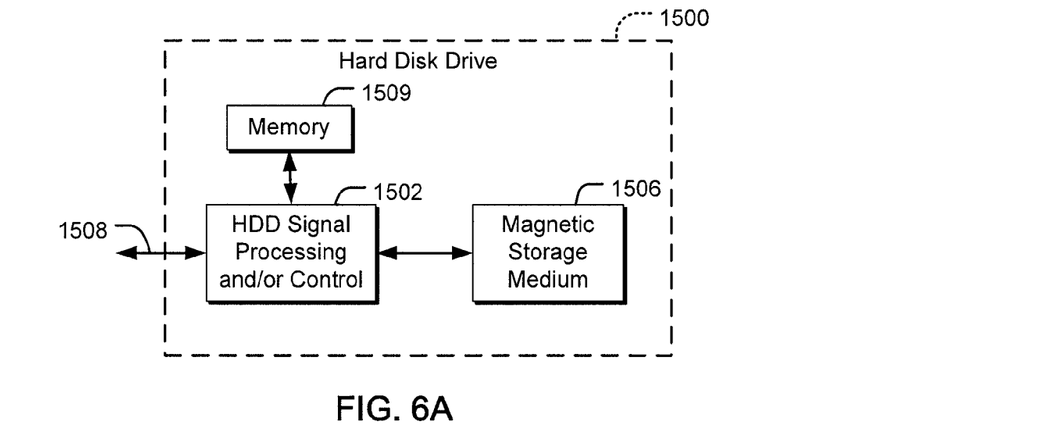
FIG. 6A is a block diagram of the invention in a hard disk drive.

Referring now to FIGS. 6A-6H, various exemplary implementations of the present invention are shown. Referring to FIG. 6A, the present invention may be embodied as a MOS device in a hard disk drive (HDD) 1500. The present invention may implement either or both signal processing and/or control circuits, which are generally identified in FIG. 6A at 1502. In some implementations, signal processing and/or control circuit 1502 and/or other circuits (not shown) in HDD 1500 may process data, perform coding and/or encryption, perform calculations, and/or format data that is output to and/or received from a magnetic storage medium 1506.

HDD 1500 may communicate with a host device (not shown) such as a computer, mobile computing devices such as personal digital assistants, cellular phones, media or MP3 players and the like, and/or other devices via one or more wired or wireless communication links 1508. HDD 1500 may be connected to memory 1509, such as random access memory (RAM), a low latency nonvolatile memory such as flash memory, read only memory (ROM) and/or other suitable electronic data storage.

Figure 6B:
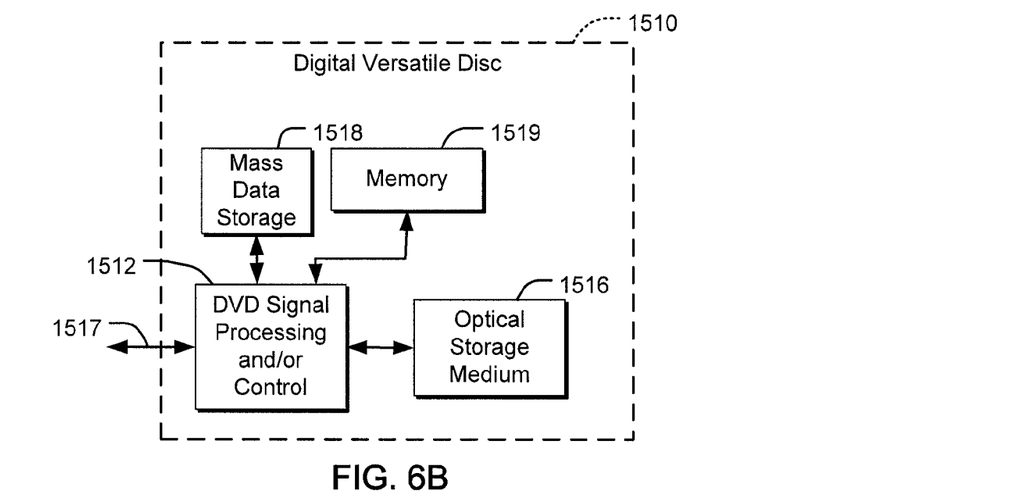
FIG. 6B is a block diagram of the invention in a DVD drive.

Referring now to FIG. 6B, the present invention may be embodied as a MOS device in a digital versatile disc (DVD) drive 1510. The present invention may implement either or both signal processing and/or control circuits, which are generally identified in FIG. 6B at 1512, and/or mass data storage 1518 of DVD drive 1510. Signal processing and/or control circuit 1512 and/or other circuits (not shown) in DVD 1510 may process data, perform coding and/or encryption, perform calculations, and/or format data that is read from and/or data written to an optical storage medium 1516. In some implementations, signal processing and/or control circuit 1512 and/or other circuits (not shown) in DVD 1510 can also perform other functions such as encoding and/or decoding and/or any other signal processing functions associated with a DVD drive.

DVD drive 1510 may communicate with an output device (not shown) such as a computer, television or other device via one or more wired or wireless communication links 1517. DVD 1510 may communicate with mass data storage 1518 that stores data in a nonvolatile manner. Mass data storage 1518 may include a hard disk drive (HDD) such as that shown in FIG. 6A. The HDD may be a mini HDD that includes one or more platters having a diameter that is smaller than approximately 1.8". DVD 1510 may be connected to memory 1519, such as RAM, ROM, low latency nonvolatile memory such as flash memory, and/or other suitable electronic data storage.

Figure 6C:
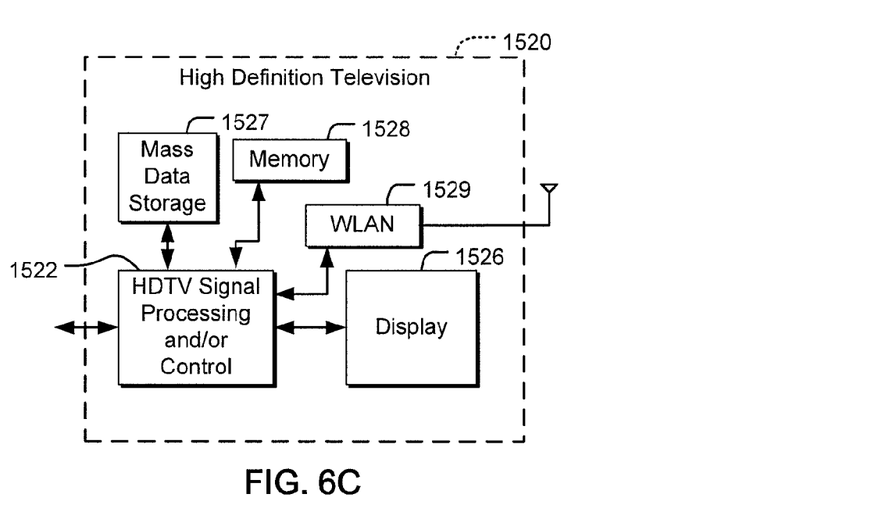
FIG. 6C is a block diagram of the invention in a high definition television (HDTV).

Referring now to FIG. 6C, the present invention may be embodied as a MOS device in a high definition television (HDTV) 1520. The present invention may implement either or both signal processing and/or control circuits, which are generally identified in FIG. 6C at 1522, a wireless area network (WLAN) interface and/or mass data storage of the HDTV 1520. HDTV 1520 receives HDTV input signals in either a wired or wireless format and generates HDTV output signals for a display 1526. In some implementations, signal processing circuit and/or control circuit 1522 and/or other circuits (not shown) of HDTV 1520 may process data, perform coding and/or encryption, perform calculations, format data and/or perform any other type of HDTV processing that may be required.

HDTV 1520 may communicate with mass data storage 1527 that stores data in a nonvolatile manner such as optical and/or magnetic storage devices. At least one HDD may have the configuration shown in FIG. 6A and/or at least one DVD may have the configuration shown in FIG. 6B. The HDD may be a mini HDD that includes one or more platters having a diameter that is smaller than approximately 1.8". HDTV 1520 may be connected to memory 1528 such as RAM, ROM, low latency nonvolatile memory such as flash memory and/or other suitable electronic data storage. HDTV 1520 also may support connections with a WLAN via a WLAN network interface 1529.

Figure 6D:
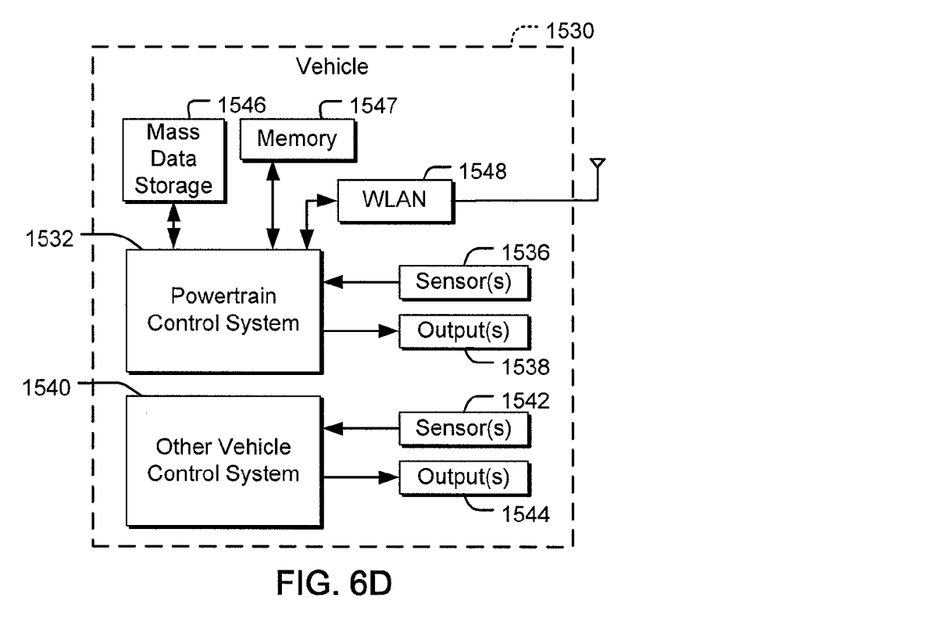
FIG. 6D is a block diagram of the invention in a vehicle control system.

Referring now to FIG. 6D, the present invention may be embodied as a MOS device in a control system of a vehicle 1530, a WLAN interface and/or mass data storage of the vehicle control system. In some implementations, the present invention implements a powertrain control system 1532 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be embodied in other control systems 1540 of vehicle 1530. Control system 1540 may likewise receive signals from input sensors 1542 and/or output control signals to one or more output devices 1544. In some implementations, control system 1540 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 1532 may communicate with mass data storage 1546 that stores data in a nonvolatile manner. Mass data storage 1546 may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". Powertrain control system 1532 may be connected to memory 1547 such as RAM, ROM, low latency nonvolatile memory such as flash memory and/or other suitable electronic data storage. Powertrain control system 1532 also may support connections with a WLAN via a WLAN network interface 1548. The control system 1540 may also include mass data storage, memory and/or a WLAN interface (all not shown).

Figure 6E:
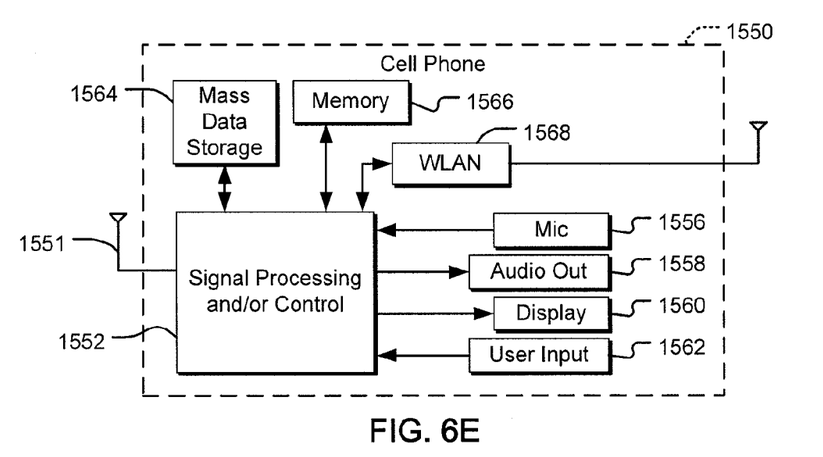
FIG. 6E is a block diagram of the invention in a cellular or mobile phone.

Referring now to FIG. 6E, the present invention may be embodied as a MOS device in a cellular phone 1550 that may include a cellular antenna 1551. The present invention may implement either or both signal processing and/or control circuits, which are generally identified in FIG. 6E at 1552, a WLAN interface and/or mass data storage of the cellular phone 1550. In some implementations, cellular phone 1550 includes a microphone 1556, an audio output 1558 such as a speaker and/or audio output jack, a display 1560 and/or an input device 1562 such as a keypad, pointing device, voice actuation and/or other input device. Signal processing and/or control circuits 1552 and/or other circuits (not shown) in cellular phone 1550 may process data, perform coding and/or encryption, perform calculations, format data and/or perform other cellular phone functions.

Cellular phone 1550 may communicate with mass data storage 1564 that stores data in a nonvolatile manner such as optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". Cellular phone 1550 may be connected to memory 1566 such as RAM, ROM, low latency nonvolatile memory such as flash memory and/or other suitable electronic data storage. Cellular phone 1550 also may support connections with a WLAN via a WLAN network interface 1568.

Figure 6F:
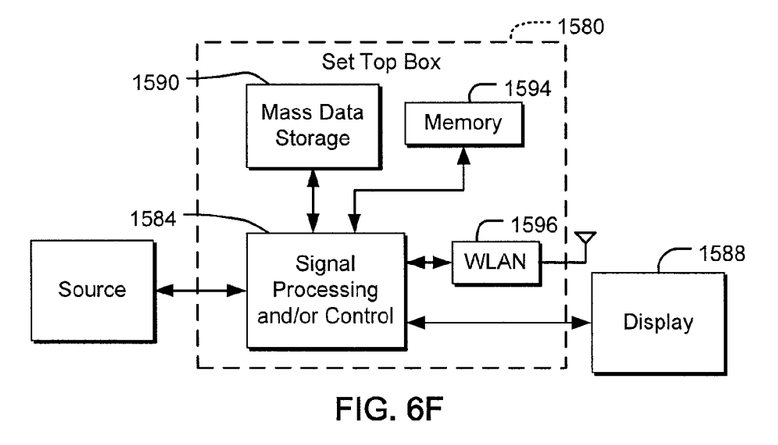
FIG. 6F is a block diagram of the invention in a set-top box (STB).

Referring now to FIG. 6F, the present invention may be embodied as a MOS device in a set top box 1580. The present invention may implement either or both signal processing and/or control circuits, which are generally identified in FIG. 6F at 1584, a WLAN interface and/or mass data storage of the set top box 1580. Set top box 1580 receives signals from a source such as a broadband source and outputs standard and/or high definition audio/video signals suitable for a display 1588 such as a television and/or monitor and/or other video and/or audio output devices. Signal processing and/or control circuits 1584 and/or other circuits (not shown) of the set top box 1580 may process data, perform coding and/or encryption, perform calculations, format data and/or perform any other set top box function.

Set top box 1580 may communicate with mass data storage 1590 that stores data in a nonvolatile manner. Mass data storage 1590 may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". Set top box 1580 may be connected to memory 1594 such as RAM, ROM, low latency nonvolatile memory such as flash memory and/or other suitable electronic data storage. Set top box 1580 also may support connections with a WLAN via a WLAN network interface 1596.

Figure 6G:
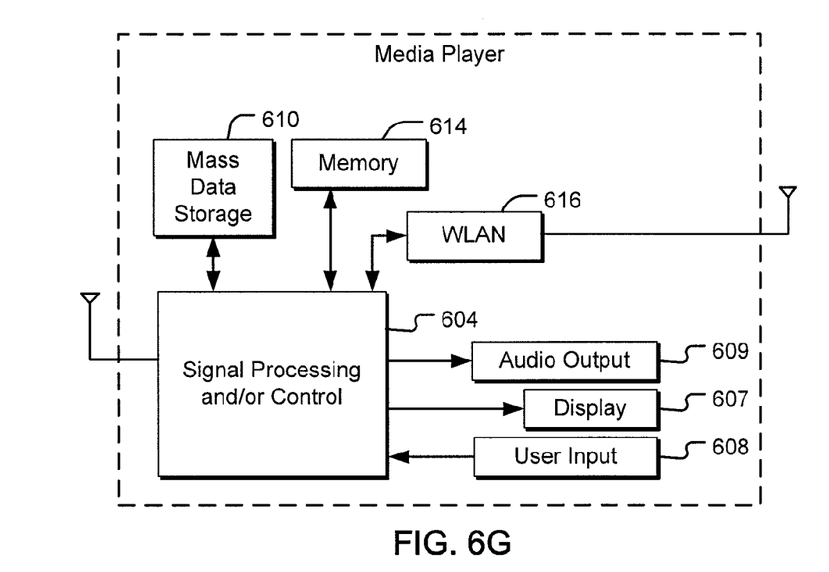
FIG. 6G is a block diagram of the invention in a media player.

Referring now to FIG. 6G, the present invention may be embodied as a MOS device in a media player 600. The present invention may implement either or both signal processing and/or control circuits, which are generally identified in FIG. 6G at 604, a WLAN interface and/or mass data storage of the media player 600. In some implementations, media player 600 includes a display 607 and/or a user input 608 such as a keypad, touchpad and the like. In some implementations, media player 600 may employ a graphical user interface (GUI) that typically employs menus, drop down menus, icons and/or a point-and-click interface via display 607 and/or user input 608. Media player 600 further includes an audio output 609 such as a speaker and/or audio output jack. Signal processing and/or control circuits 604 and/or other circuits (not shown) of media player 600 may process data, perform coding and/or encryption, perform calculations, format data and/or perform any other media player function.

Media player 600 may communicate with mass data storage 610 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". Media player 600 may be connected to memory 614 such as RAM, ROM, low latency nonvolatile memory such as flash memory and/or other suitable electronic data storage. Media player 600 also may support connections with a WLAN via a WLAN network interface 616. Still other implementations in addition to those described above are contemplated.

Figure 6H:
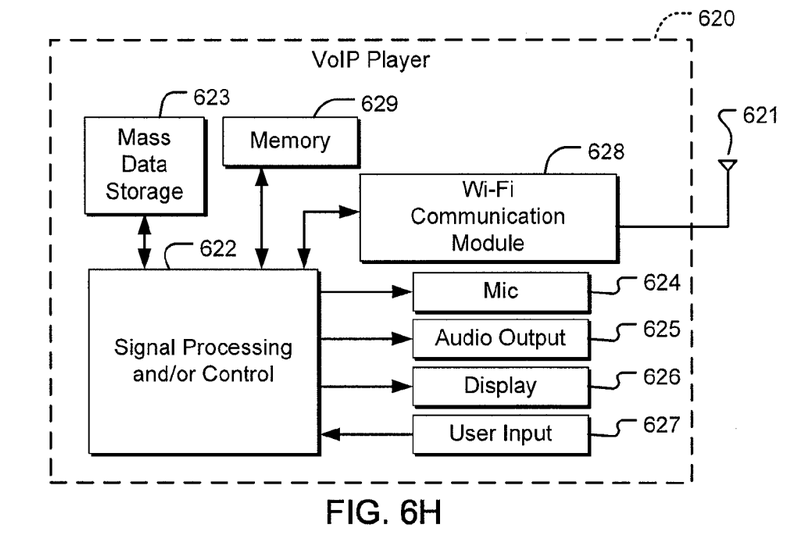
FIG. 6H is a block diagram of the invention in a VoIP player.

Referring to FIG. 6H, the present invention may be embodied as MOS device in a Voice over Internet Protocol (VoIP) phone 620 that may include an antenna 621. The present invention may implement either or both signal processing and/or control circuits, which are generally identified in FIG. 6H at 622, a wireless interface and/or mass data storage of the VoIP phone 623. In some implementations, VoIP phone 620 includes, in part, a microphone 624, an audio output 625 such as a speaker and/or audio output jack, a display monitor 626, an input device 627 such as a keypad, pointing device, voice actuation and/or other input devices, and a Wireless Fidelity (Wi-Fi) communication module 628. Signal processing and/or control circuits 622 and/or other circuits (not shown) in VoIP phone 620 may process data, perform coding and/or encryption, perform calculations, format data and/or perform other VoIP phone functions.

VoIP phone 620 may communicate with mass data storage 623 that stores data in a nonvolatile manner such as optical and/or magnetic storage devices, for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". VoIP phone 620 may be connected to memory 629, which may be a RAM, ROM, low latency nonvolatile memory such as flash memory and/or other suitable electronic data storage. VoIP phone 620 is configured to establish communications link with a VoIP network (not shown) via Wi-Fi communication module 628.

The invention has been described above with respect to particular illustrative embodiments. It is understood that the invention is not limited to the above-described embodiments and that various changes and modifications may be made by those skilled in the relevant art without departing from the spirit and scope of the invention.

What is claimed is:

1. A Metal Oxide Semiconductor (MOS) device formed on a substrate, the MOS device comprising:
   a drain region, wherein the drain region has a shape of a rectangle or a square;
   a gate region (i) surrounding the drain region and (ii) formed in a closed loop around the drain region, wherein the closed loop has a shape corresponding to the shape of the drain region;
   a plurality of source regions (i) arranged around the gate region and (ii) across from the drain region; and
   a plurality of bulk regions arranged around the gate region,
   wherein a first source region of the plurality of source regions comprises a first side that (i) faces the drain region and (ii) has a first maximum width,
   wherein a second source region of the plurality of source regions comprises a first side that (i) faces the drain region and (ii) has a second maximum width, the second maximum width being substantially different from the first maximum width,
   wherein the first maximum width of the first side of the first source region is substantially equal to a maximum width of the gate region,
   wherein the second maximum width of the first side of the second source region is substantially equal to a maximum width of the drain region, and
   wherein the maximum width of the gate region is different from the maximum width of the drain region.

2. The MOS device of claim 1, wherein:
   the substrate has a shape corresponding to the shape of the drain region; and
   each bulk region of the plurality of bulk regions is arranged in a corresponding corner of the substrate.

3. The MOS device of claim 1, wherein a channel region is formed beneath the gate region.

4. The MOS device of claim 3, wherein the channel region is configured so that current flows from each source region to the drain region.

5. The MOS device of claim 1, wherein the MOS device is a transistor.

6. The MOS device of claim 1, wherein the substrate is a silicon substrate, and the gate region includes polysilicon.

7. The MOS device of claim 6, wherein the MOS device is a Square Double-Diffused Metal Oxide Semiconductor (SQDMOS).

8. The MOS device of claim 1, wherein:
   the drain region includes a first drain region contact; at least one of the source regions includes a first source region contact; and
   a distance between (i) the first drain region contact and (ii) the gate region is greater than a distance between (i) the first source region contact and (ii) the gate region.

9. The MOS device of claim 1, wherein:
   each bulk region of the plurality of bulk regions separates two corresponding source region of the plurality of source regions.

10. The MOS device of claim 1, wherein:
    the plurality of source regions comprises (i) the first source region, (ii) the second source region, (iii) a third source region, and (iv) a fourth source region;
    the drain region has (i) a first side, (ii) a second side that is perpendicular to the first side, (iii) a third side that is opposite to and parallel to the first side, and (iv) a fourth side that is opposite to and parallel to the second side;
    the first source region, the second source region, the third source region, and the fourth source region are arranged facing the first side, the second side, the third side, and the fourth side, respectively, of the drain region;
    the third source region comprises a first side that (i) faces the drain region and (ii) has a third maximum width, wherein the third maximum width of the first side of the third source region is substantially equal to the first maximum width of the first side of the first source region; and
    the fourth source region comprises a first side that (i) faces the drain region and (ii) has a fourth maximum width, wherein the fourth maximum width of the first side of the fourth source region is substantially equal to the second maximum width of the first side of the second source region.

11. The MOS device of claim 1, wherein: each of the plurality of source regions has a shape of a rectangle.

* * * * *